US012105566B2

(12) United States Patent
Asada et al.

(10) Patent No.: US 12,105,566 B2
(45) Date of Patent: *Oct. 1, 2024

(54) DISPLAY DEVICE

(71) Applicant: Japan Display Inc., Tokyo (JP)

(72) Inventors: Keisuke Asada, Minato-ku (JP); Hideaki Abe, Minato-ku (JP); Kota Uogishi, Minato-ku (JP); Kazuyuki Yamada, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,030

(22) Filed: Jul. 5, 2023

(65) Prior Publication Data

US 2023/0350470 A1    Nov. 2, 2023

Related U.S. Application Data

(63) Continuation of application No. 17/660,706, filed on Apr. 26, 2022, now Pat. No. 11,740,668, which is a (Continued)

(30) Foreign Application Priority Data

Jun. 24, 2019  (JP) .................................. 2019-116509

(51) Int. Cl.
*G06F 1/00*    (2006.01)
*G06F 1/16*    (2006.01)
(Continued)

(52) U.S. Cl.
CPC ............. *G06F 1/189* (2013.01); *G06F 1/1605* (2013.01); *G06F 1/1652* (2013.01); *G09F 9/301* (2013.01)

(58) Field of Classification Search
CPC ...... G06F 1/189; G06F 1/1605; G06F 1/1652; G09F 9/301
See application file for complete search history.

(56) References Cited

U.S. PATENT DOCUMENTS 7,115,980 B2 * 10/2006 Miyagawa ........... H05K 1/0281
257/668
11,515,503 B2   11/2022 Shin et al.
(Continued)

FOREIGN PATENT DOCUMENTS

JP    2010230719 A    10/2010
JP    2018169541 A    11/2018
JP    2019057673 A     4/2019

OTHER PUBLICATIONS

Office Action issued Jan. 31, 2023, in corresponding Japanese Application No. 2019-116509, 31 pages.

*Primary Examiner* — Pete T Lee
(74) *Attorney, Agent, or Firm* — Maier & Maier, PLLC

(57) ABSTRACT

An electronic device includes a substrate having a first surface and a second surface opposite the first surface and including an input terminal part on the first surface, a wiring substrate having a flexibility connected to the input terminal part, and an electronic component on the second surface of the substrate. The wiring substrate has an opening through the wiring substrate, and the opening overlaps with the electronic component when the wiring substrate is bent to a side of the second surface of the substrate.

7 Claims, 13 Drawing Sheets

Related U.S. Application Data continuation of application No. 16/899,784, filed on Jun. 12, 2020, now Pat. No. 11,340,667.

(51) Int. Cl.
  *G06F 1/18* (2006.01)
  *G09F 9/30* (2006.01)

(56) References Cited

U.S. PATENT DOCUMENTS

| | | |
|---|---|---|
| 2004/0174663 A1* | 9/2004 | Itokawa ............... H05K 1/147 |
| | | 361/600 |
| 2008/0088768 A1 | 4/2008 | Kohno |
| 2015/0173171 A1 | 6/2015 | Kim et al. |
| 2016/0100486 A1* | 4/2016 | Chen .................... H05K 1/189 |
| | | 361/783 |
| 2016/0198560 A1 | 7/2016 | Shin et al. |
| 2016/0219706 A1 | 7/2016 | Jo et al. |
| 2017/0242457 A1 | 8/2017 | Lee et al. |

* cited by examiner

DISPLAY DEVICE

CROSS-REFERENCE TO RELATED APPLICATIONS

The present application is a continuation Application of U.S. application Ser. No. 17/660,706, filed on Apr. 26, 2022, which is a continuation Application of U.S. application Ser. No. 16/899,784, filed on Jun. 12, 2020, now U.S. Pat. No. 11,340,667, issued on May 24, 2022, which claims the benefit of priority from the prior Japanese Patent Application No. 2019-116509, filed on Jun. 24, 2019, the entire contents of each of which are incorporated herein by reference.

FIELD

One embodiment of the present invention relates to a display device in which a wiring substrate having flexibility and a display panel are connected, an electric device in which the wiring substrate having flexibility is connected to various substrates such as a sensor substrate and the manufacturing method thereof.

BACKGROUND

A flexible printed wiring substrate is used to connect the display panel to a printed circuit board (PCB). The flexible printed wiring substrate is a substrate in which the electric circuitry is formed by a metallic foil bonded to a base film. The flexible printed wiring substrate has a flexibility and can be bent freely, making it an indispensable component for miniaturization, weight reduction, and thinning of various electronic devices such as a smart phone, a tablet device, a personal computer, and a liquid crystal TV. Similarly, the flexible printed wiring substrate is also used for the main substrate of an electric device that constitutes the sensor substrate, etc.

The flexible printed wiring substrate, since the base film is formed of a heat-resistant and mechanical strength strong resinous material such as polyimide, is molded into various shapes in accordance with the arrangement of a terminal of the electronic device. For example, in addition to a rectangular connection part with the electronic device, a connection part having a bifurcated configuration is known.

SUMMARY

An electronic device in an embodiment according to the present invention includes a substrate including an input terminal arranged a plurality of terminals, a wiring substrate having a flexibility connected to the input terminal part. The wiring substrate includes a base film having a first surface and a second surface opposite to the first surface, a cover film covering the first surface of the base film, a plurality of wirings between the base film and the cover film, a connection part in which the plurality of wirings is exposed from the cover film and arranged along one side of the base film. The wiring substrate includes a first region bent in a direction crossing the one side and a second region adjacent to the first region. The second region of the connection part includes a first connection terminal group connected to the plurality of wirings, a second connection terminal group, and a dummy terminal group arranged between the first connection terminal group and the second connection terminal group and not connected to the plurality of wirings. The first region is provided with an opening through the base film and the cover film, the second region overlaps the input terminal part, and the dummy terminal group and the opening of the first region are adjacent to each other.

A method for manufacturing an electronic device in an embodiment according to the present invention, the method including bonding a display panel and a wiring substrate, the display panel including display part arranged a plurality of pixels and a input terminal part arranged a plurality of terminals and the wiring substrate having a flexibility that a plurality of wirings arranged between a base film and a cover film, and a connection part exposed the plurality of wirings from the cover film, the bonding electrically connects the input terminal part and the connection part, and after the adhesion, removing together with the base film and the cover film that a part of the area of the wiring substrate other than the area where the plurality of wirings is provided.

A display device in an embodiment according to the present invention includes a display panel including a display part arranged a plurality of pixels and a terminal part arranged a plurality of terminals, a wiring substrate having flexibility that connected to the input terminal part. The wiring substrate includes a base film having a first surface and a second surface opposite to the first surface, a cover film covering the first surface of the base film, a plurality of wirings between the base film and the cover film, and a connection part in which the plurality of wirings is exposed from the cover film and arranged along one side of the base film. The display panel includes a curved surface along the one side, the wiring substrate is curved in accordance with the curvature of the display panel, and the wiring substrate includes a first region and a second region, and the cross-sectional area of the first region in the direction parallel to the one side is smaller than the cross-sectional area of the second region.

DESCRIPTION OF EMBODIMENTS

Figure 1:
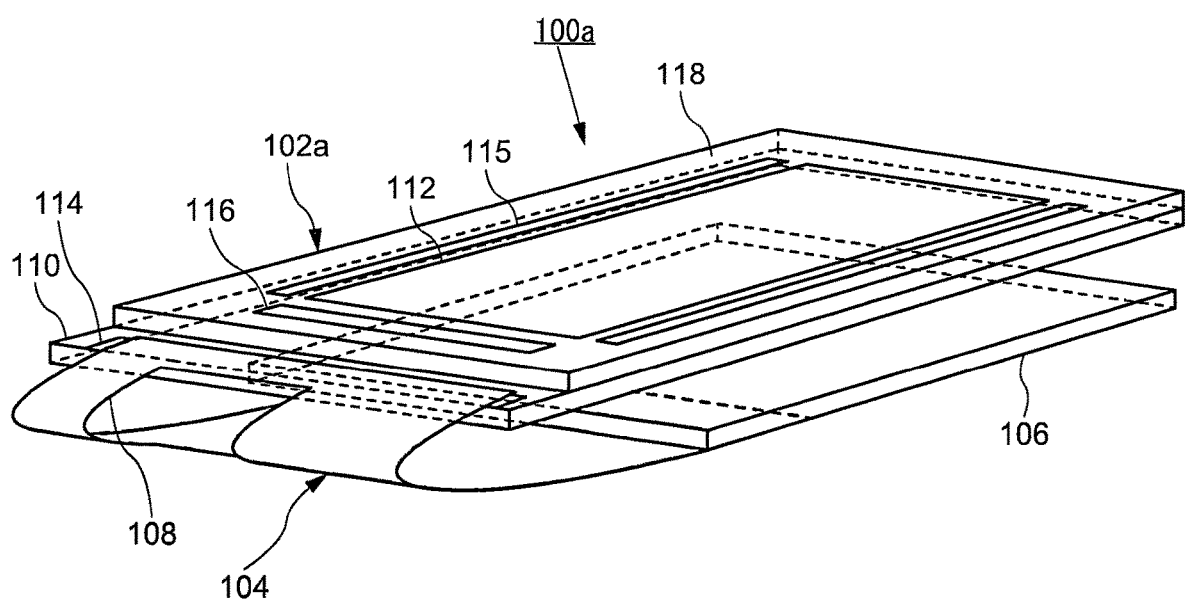
FIG. 1 shows a perspective view of a display device according to an embodiment of the present invention.

Hereinafter, embodiments of the present invention will be described with reference to the drawings and the like. The present invention may be carried out in various forms without departing from the gist thereof and is not to be construed as being limited to any of the following embodiments. For example, although the embodiment of the present invention will be described with reference to a display panel, the present invention is not limited to this, and the display panel may be replaced with a main substrate of a sensor substrate or other electric devices as long as the substrate has a plurality of terminals to which a flexible printed circuit board is connected. In the drawings, components may be shown schematically regarding the width, thickness, shape, and the like, instead of being shown in accordance with the actual form, for the sake of clear illustration. In the present specification and each figure, elements similar to those described above with respect to the previously described figures are denoted by the same reference numerals (or a number followed by a, b, etc.), and detailed description thereof may be omitted. In addition, the letters appended "first" and "second" for each element are expedient signs used to distinguish between the elements and have no further meaning unless otherwise stated.

In this specification, when a member or region is "up (or below)" of another member or region, unless otherwise specified, this includes not only a case where it is directly above (or directly below) another member or region but also a case where it is above (or lower) another member or region. That is, it includes the case where another component is included in between above (or lower) another member or region.

First Embodiment

A configuration of a display device 100a according to an embodiment of the present invention will be described in this embodiment. As shown in FIG. 1, the display device 100a includes a display panel 102a and a wiring substrate 104. The display panel 102a is connected to an optional circuit board 106 by the wiring substrate 104. The circuit board 106 is located at any location.

For example, from the viewpoint of design, the display panel is required to narrow a region (also referred to as a frame region) surrounding a display area, i.e., a so-called frame narrowing. A module with the flexible printed wiring substrate or the like mounted on the display panel must be sharply bent on the flexible printed wiring substrate to accommodate them in a housing with the narrow frame region.

The flexible printed wiring substrate must be thickened in order to narrow the pitch of a terminal. On the other hand, when the thickness of the flexible printed wiring substrate is increased, the elastic force is increased and the repulsive force against bending is increased.

In this embodiment, the circuit board 106 is located on the back side of the display panel 102a for compact stored in the housing of the display device. The wiring substrate 104 has a flexibility and is folded to connect the display panel 102a and the circuit board 106. The wiring substrate 104 is formed with an opening 108 at a position overlapping a region to be folded.

The display panel 102a includes a display part 112 formed on a substrate 110 and an input terminal 114 provided at one end of the substrate 110. The display panel 102a may be provided with a vertical driving circuit 115 and a horizontal driving circuit 116 on the outer side of the display part 112. The display panel 102a may be provided with a counter substrate 118 to cover at least the display part 112. Other components (e.g., backlights) may be provided between the display panel 102a and the circuit board 106. The display device 100a displays an image by inputting a signal representing an image from the circuit board 106 to the display panel 102a via the wiring substrate 104, and inputting the signal to the display part 112 by the vertical driving circuit 115 and the horizontal driving circuit 116. In the case where the display device 100a is replaced with an electric device, in particular, the substrate 110 of the display panel 102a is a main substrate in which various members for configuring the functions of the electric device are arranged, and for example, in the case of a fingerprint sensor or a touch panel, the display part 112 may be replaced with a fingerprint detection region or a touch detection region, and the substrate 102a may be replaced with a main substrate in which electrodes or sensors for realizing the functions of fingerprint detection and touch detection are arranged. Even in this case, the main substrate has the input terminal 114, the wiring substrate 104 connected to the input terminal 114 is formed with the opening 108.

Figure 2:
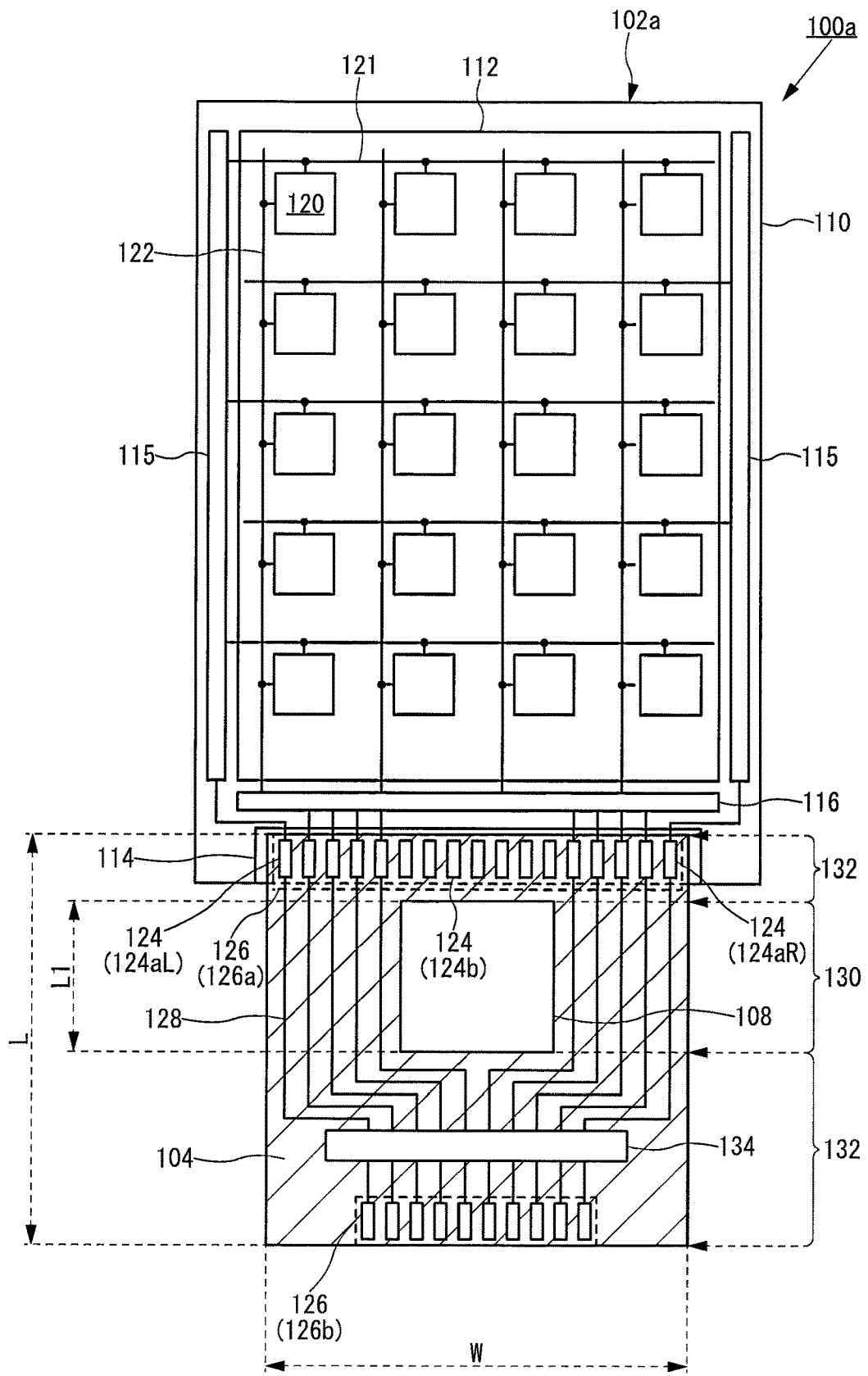
FIG. 2 shows a state in which a display panel and a wiring substrate are connected that constitute a display device according to an embodiment of the present invention.

FIG. 2 shows a configuration in which the display panel 102a and the wiring substrate 104 are connected. The display panel 102a includes the display part 112 on the substrate 110 and the input terminal 114 located on the exterior of the display part 112. The display part 112 is arranged with a plurality of pixels 120, and a plurality of scanning signal lines 121 and a data signal line 122 are arranged to input the signals to each of the plurality of pixels 120. The plurality of scanning signal lines 121 is electrically connected to the vertical driving circuit 115 and a plurality of data signal lines 122 is electrically connected to the horizontal driving circuit 116. The vertical driving circuit 115 includes a circuit for outputting the scanning signal to the scanning signal line 121, and the horizontal driving circuit 116 includes a selector circuit for selecting the data signal line 122 for outputting a video signal.

The pixel 120 includes a display element. As the display element, a liquid crystal element in which a liquid crystal layer is provided between a pair of electrodes, an organic electroluminescent element in which an organic layer containing an organic electroluminescent material is provided between a pair of electrodes, or a micro LED, or the like are used. The display part 112 is provided with circuits for driving the display element for each pixel 120.

The input terminal 114 is arranged at one end of the substrate 110. The input terminal 114 includes a plurality of terminals 124. The plurality of terminals 124 is arranged along one side of the substrate 110 at a predetermined pitch. The input terminal 114 is a portion where a signal for displaying an image on the display part 112 is input, a region which is connected with a conductive adhesive so as to form an electrical connection with the wiring substrate 104.

The wiring substrate 104 includes a wiring 128 and a connection part 126 that forms a connection with the input terminal 114. The connection part 126 includes a first connection part 126a for connection with the display panel 102a and a second connection part 126b for connection with the circuit board (not shown in FIG. 2). The wiring 128 is provided to electrically connect between the first connection part 126a and the second connection part 126b. A driver IC 134 may be implemented in the wiring substrate 104. The wiring 128 is arranged to electrically connect between the first connection part 126a and the driver IC 134 and between the driver IC 134 and the second connection part 126b.

The wiring substrate 104 has flexibility and includes a first region 130 and a second region 132 adjoining the first region 130. The first region 130 is defined as a region that includes a portion where the wiring substrate 104 is folded and may also be referred to as a folded region. The second region 132 is defined as a region other than the folded region. The first connection part 126a and the second connection part 126b are included in the second region 132. For example, the wiring substrate 104 is bent to the back of the display panel 102a along one side of the substrate 110, as shown in FIG. 1. The first region 130 is a region including a region in which the wiring substrate 104 is bent, and the first region 130 is provided at a position adjacent to the first connection part 126a and away from the second connection part 126b. Since the first connection part 126a and the second connection part 126b are arranged outside the bending region of the wiring substrate 104, the first region 130 is arranged to be sandwiched between the two second region 132. As shown in FIG. 2, assuming that the length of the wiring substrate 104 is L and the width is W, the first region 130 occupies a part of regions of the length L (length L1) and is defined as a region having a width W.

The first region 130 includes the opening 108. The opening 108 is formed by removing a member forming the wiring substrate 104. The opening 108 is formed, for example, as a through hole penetrating the wiring substrate 104. The opening 108 is arranged to be surrounded by the wiring 128 and the connection part 126 (the first connection part 126a). As shown in FIG. 2, the first region 130 and the second region 132 occupying a constant region of each of the wiring substrate 104. Since the first region 130 includes the opening 108, a cross-sectional area of the cross section in the width direction (or a direction parallel to one side where the terminals 124 of the substrate 110 are arranged) is substantially smaller than that of the second region 132.

The display panel 102 is connected to the connection part 126 (the first connection part 126a) of the wiring substrate 104 at the input terminal 114. The input terminal 114 and the first connection part 126a are electrically connected to each other by an anisotropic conductive film (ACF) which is not shown. The wiring substrate 104 is thermocompression bonded to the input terminal 114 of the display panel 102a via the anisotropic conductive film. Thermocompression bonding is performed by applying pressure by a pressure welding tool heated by a heater or the like.

As shown in FIG. 2, the input terminal 114 is provided with the plurality of terminals 124. In addition to a first terminal 124a electrically connected to the vertical driving circuit 115 or the horizontal driving circuit 116, the plurality of terminals 124 may include a second terminal 124b (also referred to as a dummy electrode(s) or a dummy terminal(s)) not electrically connected to these driving circuits. Including the second terminal 124b in addition to the first terminal 124a, the input terminal 114 has the plurality of terminals 124 arranged at regular pitches. With this configuration of the input terminal 114, when the wiring substrate 104 is thermocompression bonded to the display panel 102a, pressure can be uniformly applied, and the effect of the thermal expansion of the wiring substrate 104 can be made uniform. As a result, it is possible to improve the bonding accuracy of the display panel 102a and the wiring substrate 104 by thermocompression bonding. As shown in FIG. 2, the first terminal 124a consists of a plurality of terminals, separated from left and right by a first terminal group (124aL) and a second terminal group (124aR). The second terminal 124b can also be referred to as a dummy terminal group 124b consisting of a plurality of terminals. The dummy terminal group 124b is located between the first terminal group 124aL and the second terminal group 124aR. The dummy terminal group 124 may be secured the shape stability of the wiring substrate 104 during thermocompression bonding, in the present embodiment, it may be in a floating state or a grounded state.

The wiring substrate 104 is formed using a resin-made film base material. The film base material can be elastically deformed from a flat state to a bent state by applying an external force. The wiring substrate 104 needs to have a high dimensional accuracy when it mounted on the input terminal 114 of the substrate 110 to cope with the high definition (narrow pitch) of the terminal. Further, there is a growing demand for narrowing the frame when the wiring substrate 104 is bent by narrowing the distance from the input terminal 114 to the first region 130 for bending the wiring substrate 104. That is, it is required to bend a small radius of curvature of the first region 130 of the wiring substrate 104 at the time of bending. In order to increase the dimensional accuracy with respect to these requests, it is conceivable to form a first terminal region 114 larger, but not only retrograde to narrowing the pitch of the terminal, but also increasing the size of the first terminal region, it is necessary to increase the size of the wiring substrate 104 accordingly, the repulsive force against bending increases when the area of the film base material of the wiring substrate 104 increases. When the repulsive force against the bending increases, it becomes an obstacle for narrowing the frame when the wiring board 104 is bent. That is, it becomes difficult to bend the radius of curvature small. On the other hand, in order to cope with the narrowing of the frame of the wiring substrate 104, it is necessary to reduce the repulsive force of the film base material, for example, using a bifurcated wiring substrate as described in the prior art document is also an effective means for reducing the repulsive force, but one terminal group and the other terminal group which are the terminal groups branched into two, are mounted on the terminals with a narrow pitch, there is a concern that the yield at the time of dimensional accuracy adjustment at the time of mounting may deteriorate. It is conceivable to mount one and the other of the branched terminals at the same time at the same time, but in this case, the difficulty of matching the respective dimensions becomes extremely high. In contrast, the wiring substrate 104 according to the present embodiment, by including the opening 108 to the first region 130 serving as a bent portion, is easily bent repulsive force is suppressed. The wiring substrate 104 further includes the second terminal 124b, so that the first terminal group 124aL and the second terminal group 124aR, which are the first terminal 124a, can be uniformly mounted simultaneously in one process.

Figure 3:
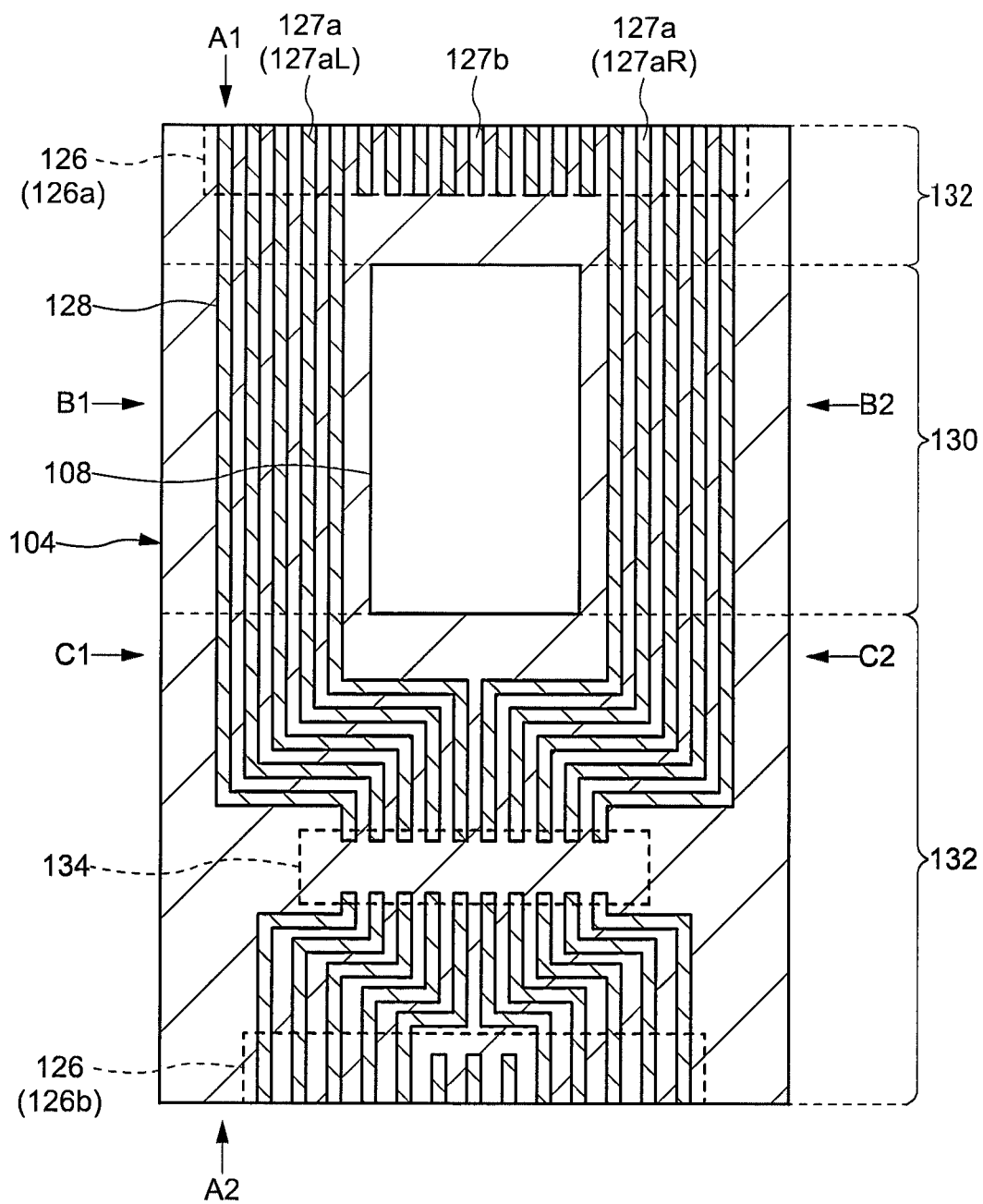
FIG. 3 shows a plane view of a wiring substrate to be used in a display device according to an embodiment of the present invention.
Figure 4A:
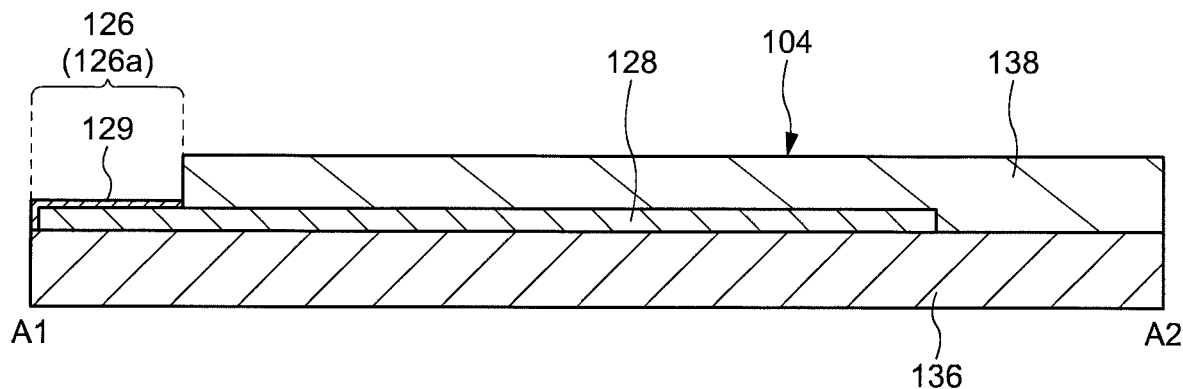
FIG. 4A shows a cross-sectional view corresponding to A1-A2 line shown in FIG. 3 of a wiring substrate to be used in a display device according to an embodiment of the present invention.
Figure 4B:
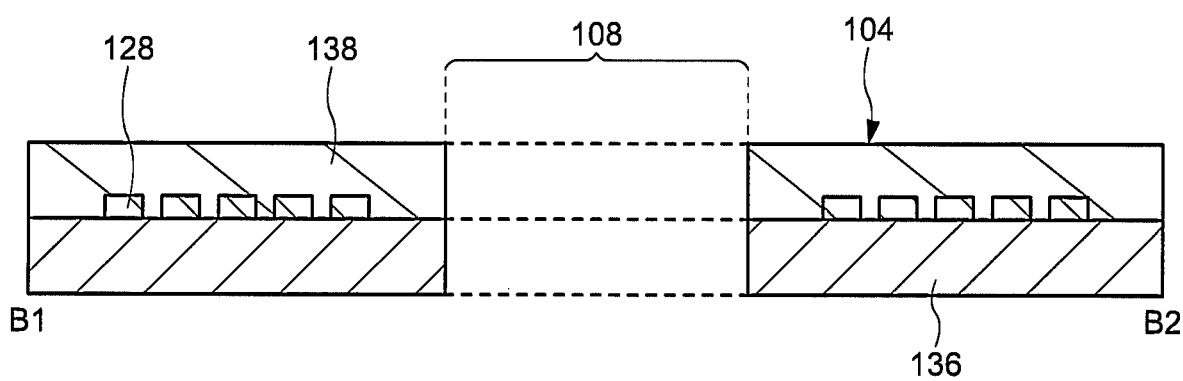
FIG. 4B shows a cross-sectional view corresponding to B1-B2 line shown in FIG. 3 of a wiring substrate to be used in a display device according to an embodiment of the present invention.
Figure 4C:
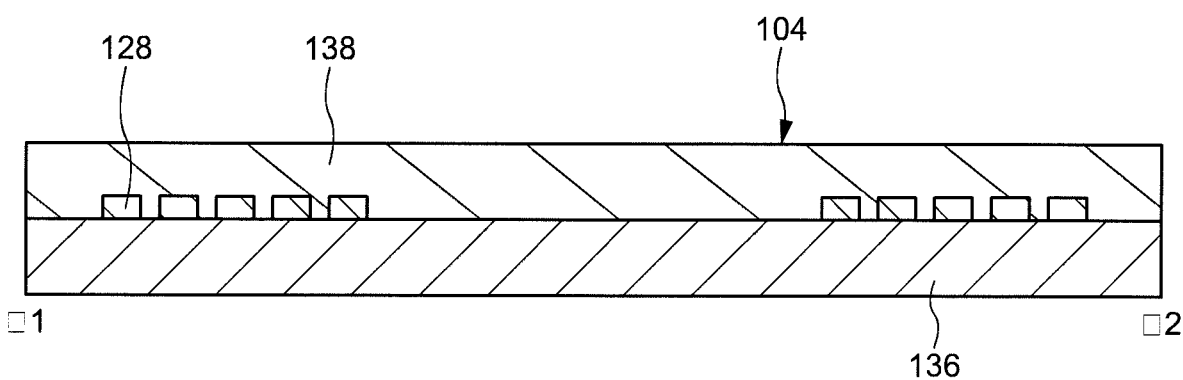
FIG. 4C shows a cross-sectional view corresponding to C1-C2 line shown in FIG. 3 of a wiring substrate to be used in a display device according to an embodiment of the present invention.

FIG. 3 shows a plane view of the wiring substrate 104. The cross-sectional constructions of A1-A2 line, B1-B2 line, and the wiring substrate 104 along C1-C2 line shown in FIG. 3 are shown in FIG. 4A, FIG. 4B, and FIG. 4C, respectively. FIG. 4A shows a cross-sectional structure of the longitudinal direction of the wiring substrate 104, FIG. 4B shows a cross-sectional structure of the first region 130, and FIG. 4C shows a cross-sectional structure of the second region 132. The following description will be given with reference to these drawings as appropriate.

The wiring substrate 104 includes a first surface and a base film 136 having a second surface opposite to the first surface, a cover film 138 covering the first surface side of the base film 136, and the wiring 128. The wiring 128 is formed of a conductor such as a metal foil is provided between the base film 136 and the cover film 138. A plurality of wirings 128 is provided on the base film 136 in an electrically isolated manner. The first connection part 126a and the second connection part 126b are formed in a region in which the wiring 128 is exposed from the cover film 138 at one end of the base film 136. As shown in the FIG. 4A, the connection part 126 may have a plated film 129 formed on the surface of the wiring 128 exposed from the cover film 138.

As previously mentioned, the wiring substrate 104 may have a region on which the driver IC 134 is implemented. The plurality of wirings 128 is provided to electrically connect between the first connection part 126a and the driver IC 134 and between the driver IC 134 and the second connection part 126b as appropriate. An adhesive (not shown) may be interposed between the cover film 138 and the base film 136.

The wiring substrate 104 is provided with the opening 108 in the first region 130. As shown in FIG. 3, the opening 108 is provided so as to be surrounded by the plurality of wirings 128 and the connection part 126. As shown in FIG. 4B, the opening 108 is a region in which the base film 136 and the cover film 138 are removed. The opening 108 may also be considered a through hole penetrating the base film 136 and the cover film 138. As is apparent from the comparison between FIG. 4B and FIG. 4C, the first region 130 includes the opening 108, thereby reducing the cross-sectional area of the cross section as compared with the second region 132.

The first region 130 includes the opening 108, the repulsive force against bending of the wiring substrate 104 is a small region compared to the second region 132. That is, the first region 130, since the substantial area is smaller than the second region 132, the rigidity is reduced and is an easily bent region. On the other hand, the first connection part 126a and the second connection part 126b are provided in the second region 132, thereby maintaining the rigidity. The connection part 126 includes a first terminal 127a connected to the wiring 128 and a second terminal 127b used as a dummy terminal, thereby ensuring shape-stability at the time of thermocompression bonding. Also for the first terminal 127a and the second terminal 127b of the wiring substrate 104, the first terminal 127a includes a first connection terminal group 127aL and a second connection terminal group 127aR, the second terminal 127b may be referred to as a dummy terminal group 127b, and the dummy terminal group 127b is located between a first connection terminal group 127L and the second connection terminal group 127aR. In this embodiment, although the dummy terminal group 127b of the wiring substrate 104 is connected to the dummy terminal group 124b of the input terminal 114, it is not connected to the wiring 128 of the wiring substrate 104.

In order to achieve with the high definition (high density of pixel) of the display part 112 in the display panel 102a, the wiring 128 of the wiring substrate 104 also needs to be high densified. To increase the density of the wiring 128, it is required to increase the rigidity of the base film 136 and to ensure the dimension is stable. When the thickness of the base film 136 is increased, the rigidity becomes high and difficult to bend the base film 136. On the other hand, in the display device 100a, there is a demand for so-called the frame narrowing, in which the frame region (peripheral region surrounding the display part 112) is narrowed at the same time as high definition is achieved. If you try to bend the wiring substrate 104 at an acute angle to meet this requirement, the repulsive force against the bending of the base film 136, a large force is applied to the input terminal 114, peeling of the terminal 124, and even if it does not lead to peeling, it is feared that the electrical connection becomes poor. However, the wiring substrate 104 according to the present embodiment can reduce the repulsive force against bending of the base film 136 by providing the opening 108 in the first region 130 serving as a bending part. In other words, even if the thickness of the base film 136 is increased, it is possible to bend the radius of curvature smaller than the conventional, it is possible to increase the reliability of the connection part.

The shape in the planar view of the opening 108 is not limited to a rectangular shape as shown in FIG. 3, and may be any shape such as a circular shape, an elliptical shape, a triangle, a polygon having a larger number of squares than a square (e.g., hexagonal), a shape in which the corners of the aforementioned square shape are rounded, and the like.

Figure 5A:
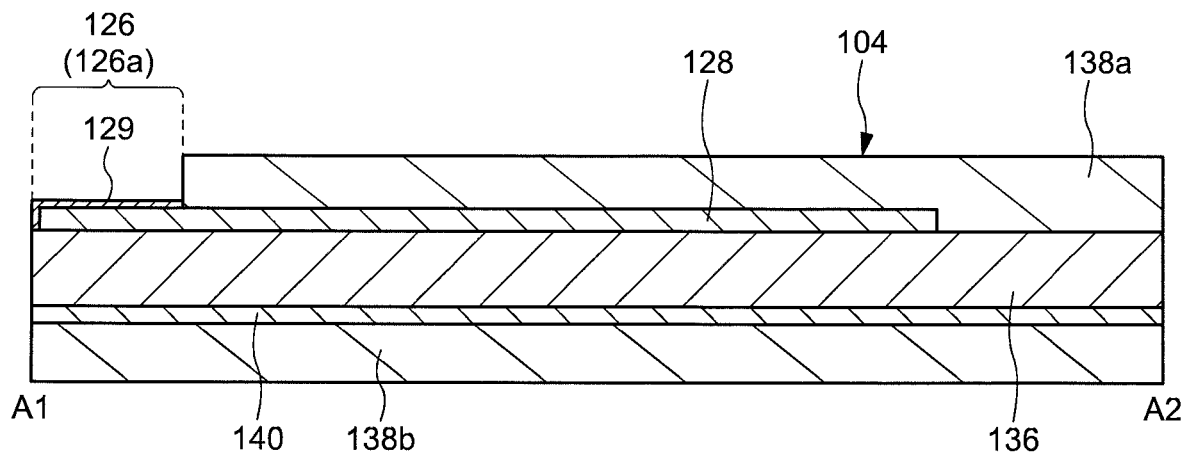
FIG. 5A shows a cross-sectional view corresponding to A1-A2 line shown in FIG. 3 of a wiring substrate to be used in a display device according to an embodiment of the present invention.
Figure 5B:
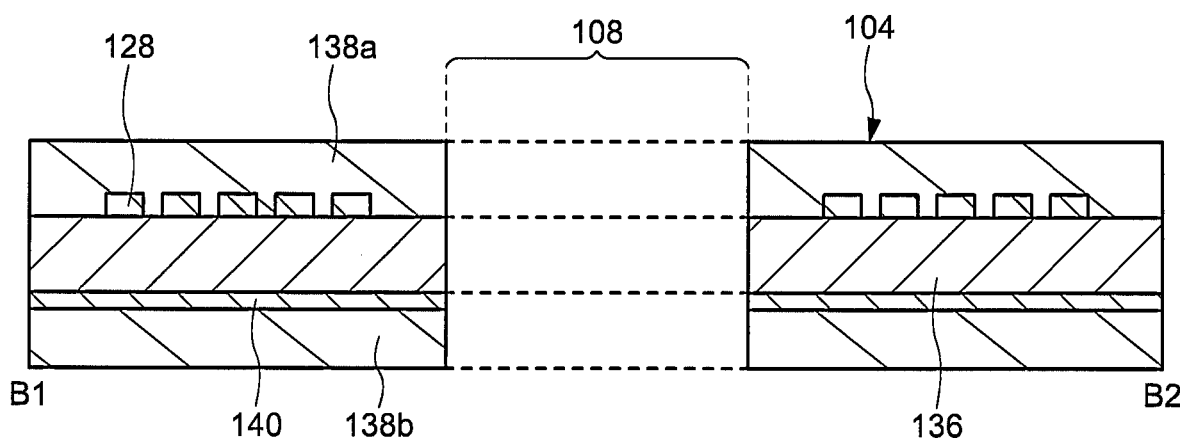
FIG. 5B shows a cross-sectional view corresponding to B1-B2 line shown in FIG. 3 of a wiring substrate to be used in a display device according to an embodiment of the present invention.
Figure 5C:
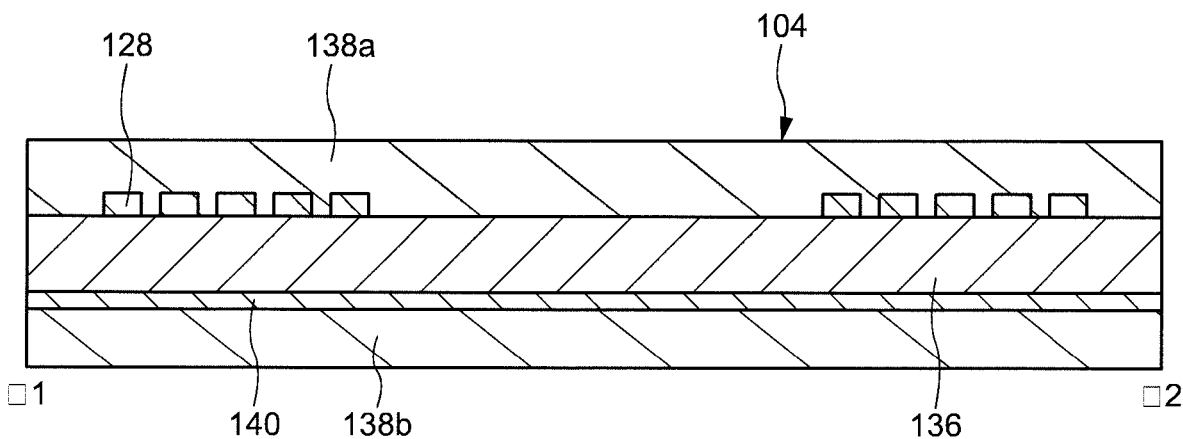
FIG. 5C shows a cross-sectional view corresponding to C1-C2 line shown in FIG. 3 of a wiring substrate to be used in a display device according to an embodiment of the present invention.

The wiring substrate 104 may be provided with a shield electrode. FIG. 5A, FIG. 5B, and FIG. 5C shows a cross-sectional structure corresponding to A1-A2 line, B1-B2 line, and C1-C2 line shown in FIG. 3, respectively, and shows a cross-sectional structure of the wiring substrate 104 in which a shield electrode 140 is provided. The shield electrode 140 is provided on substantially the entire surface of the second surface side of the base film 136 (the side opposite to the first surface where the wiring 128 is provided). The wiring substrate 104 has a configuration in which the wiring 128 is covered with a cover film 138a and the shield electrode 140 is covered with a cover film 138b. The opening 108 is provided to penetrate the cover film 138a, the base film 136, the shield electrode 140, and the cover film 138b. Thus, even when the shield electrode 140 is provided on the wiring substrate 104, it is possible to reduce the repulsive force against bending of the wiring substrate 104 by similarly providing the opening 108.

Figure 6:
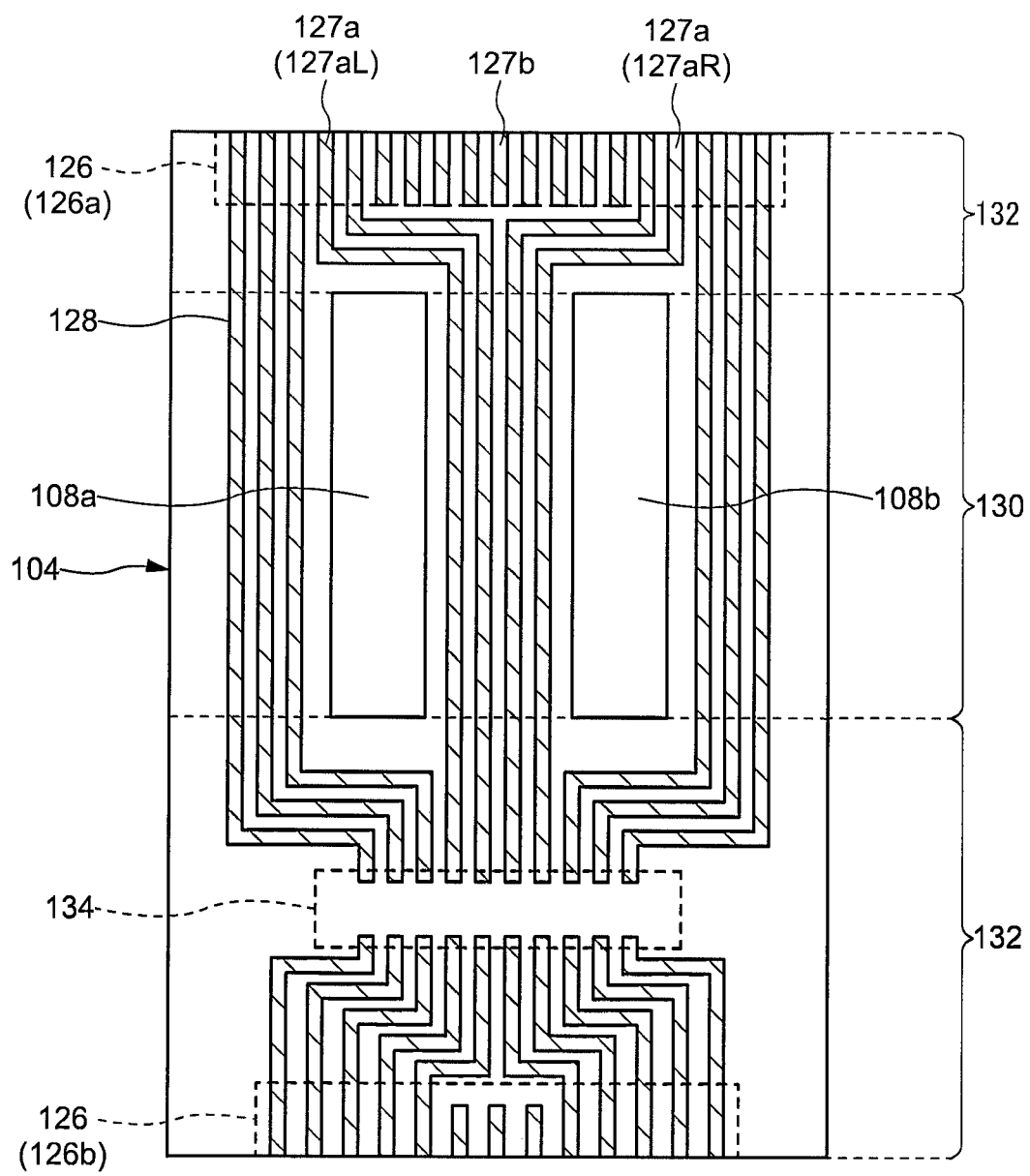
FIG. 6 shows a plane view of a wiring substrate to be used in a display device according to an embodiment of the present invention.

As shown in FIG. 6, the wiring substrate 104 may be provided with a plurality of openings 108a and 108b in the first region 130. The plurality of wirings 128 on the base film 136 is provided to surround the openings 108a, 108b. By providing the plurality of openings 108a, 108b, the opening region can be dispersed in the first region 130 and the cross-sectional area can be reduced. A configuration in which a plurality of openings is provided in the first region 130 is effective in reducing the routing length of the wiring 128 when the width of the wiring substrate 104 is widened to keep the bent state uniform.

Figure 7:
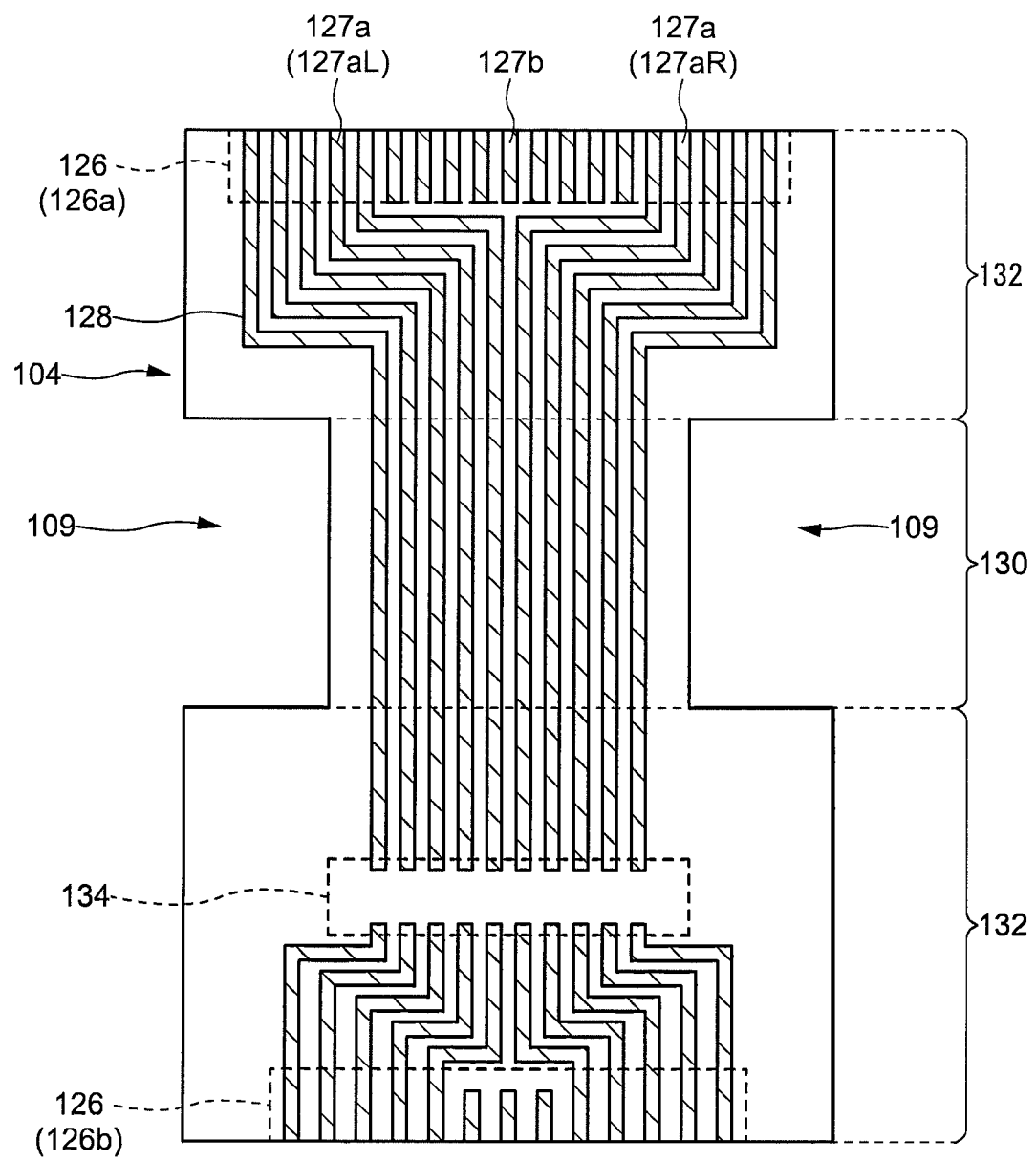
FIG. 7 shows a plane view of a wiring substrate to be used in a display device according to an embodiment of the present invention.

As shown in FIG. 7, the wiring substrate 104 may be provided with a notch portion 109 in place of the opening in the first region 130. The notch portion 109 may be provided on both sides ends of the wiring substrate 104 or may be provided on one side. In both cases, the notch portion 109 is formed as a region with the base film 136 and the cover film 138 removed. Thus, it is possible to reduce the cross-sectional area of the cross section of the first region 130 also by providing the notch portion 109, it is possible to reduce the repulsive force against bending of the wiring substrate 104.

According to this embodiment, by having the opening 108 or the notch portion 109 to the wiring substrate 104, it is possible to easily bend the wiring substrate 104. The wiring substrate 104 can be bent closer to the display panel 102a by providing one or both of the opening 108 and the notch portion 109 to the region (the first region 130) to be bent. As a result, the display device 100a can reduce the area occupied by the region (the region surrounding the display part 112) other than the display part 112, thereby narrowing the frame.

Second Embodiment

In the present embodiment, a manufacturing process of the display device 100a shown in the first embodiment will be described. In the display device 100a, the display panel 102a is manufactured, and thereafter, the wiring substrate 104 is attached to the display panel 102a.

Figure 8:
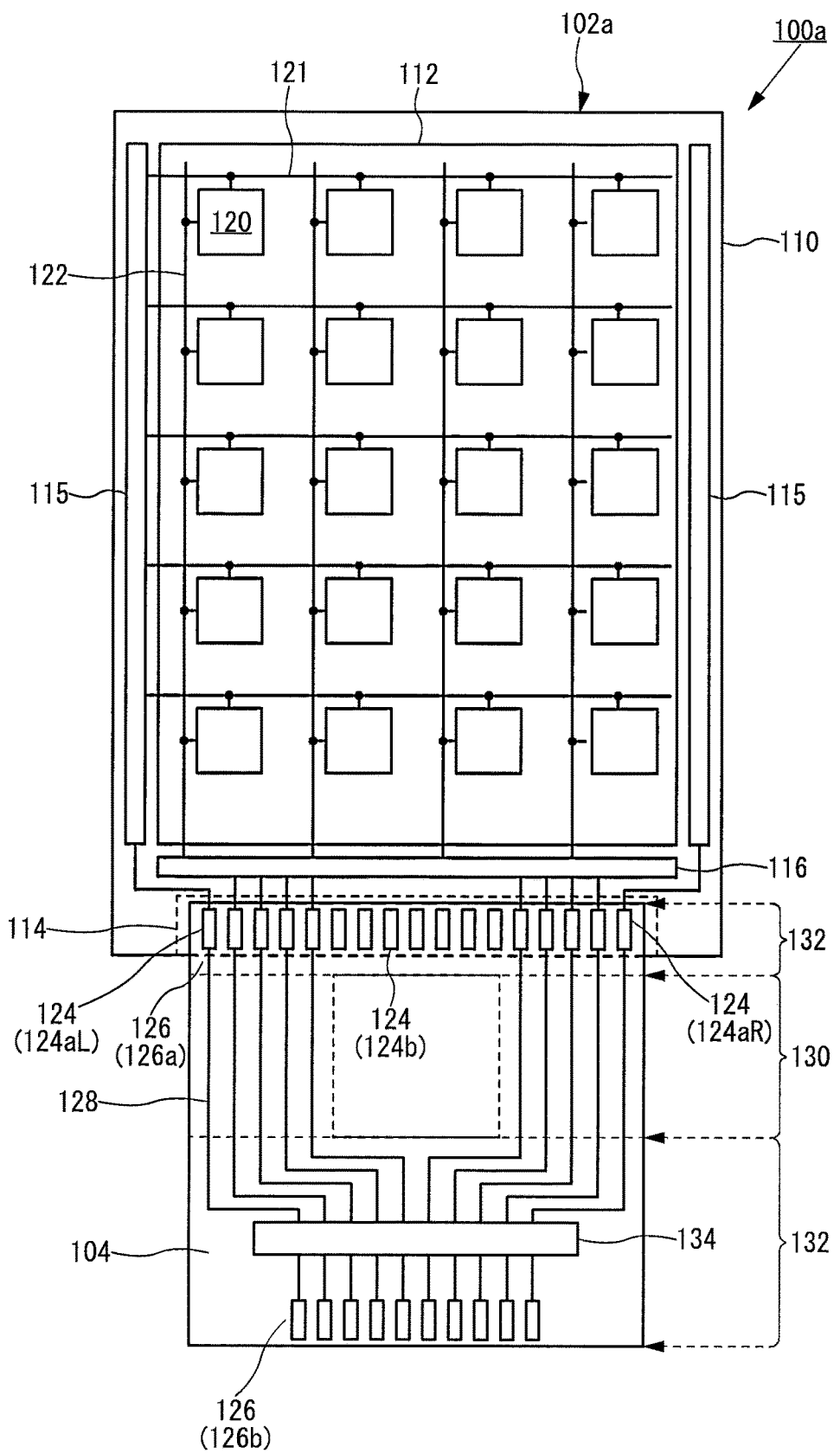
FIG. 8 is a diagram illustrating a manufacturing process of a display device according to an embodiment of the present invention, showing a state in which a wiring substrate before an opening is formed on a display panel is attached.

FIG. 8 shows the display panel 102a in which the wiring substrate 104 attached. The wiring substrate 104 is attached to the display panel 102a via the anisotropic conductive film (not shown). For example, the wiring substrate 104 is attached to the input terminal 114 by thermocompression bonding. The wiring substrate 104 includes the region which becomes the first region 130 and the region which becomes the second region 132, but the opening is not formed in the first region 130 at this stage. By attaching the wiring substrate 104 to the display panel 102a without the opening, the deflection and deformation of the connection part 126 can be suppressed, and the dimensional accuracy at the time of bonding can be kept high.

The wiring board 104 is performed a deformed processing after being attached to the display panel 102a. For example, after the wiring substrate 104 is attached to the display panel 102a, the opening 108 or the notch portion 109 is formed by laser beam processing. The wiring substrate 104 is attached to the display panel 102a so that the opening 108 can be formed proximate to the connection part 126 (the first connection part 126a). This allows the wiring substrate 104 to be folded proximate to the display panel 102a. The opening 108 or the notch portion 109 of the wiring board 104 may be formed by a die processing or a cutting processing. The opening 108 or the notch portion 109 formed in the wiring substrate 104 may be formed in the form described referring to FIGS. 3, 6, and 7, as appropriate.

According to the present embodiment, by attaching to the display panel 102a without forming the opening 108 on the wiring substrate 104, the dimensional accuracy can be improved, and it is possible to cope with the narrowing of the pitches of the terminal 124 (the first terminal group 124aL, the second terminal group 124aR, the dummy terminal group 124b). The opening 108 or the notch portion 109 may be provided proximate to the display panel 102a by forming the opening 108 or the notch portion 109 after the wiring substrate 104 is attached to the display panel 102a. Such a manufacturing process makes it possible to reduce the radius of curvature at the time of folding the wiring substrate 104 and to bend it proximate to the display panel 102a.

In the case of laser beam processing, the base film 136, the cover film 138, the shield electrode 140, or the like may have minute burnt marks or soot due to heat, but in the case of the wiring 128, the wiring 128 at a position close to the opening 108 is covered with the base film 136 or the cover film 138 so as not to affect the laser beam processing or the like, so that the soot attached to the opening 108 does not contact the wiring 128. Similarly, if the notch 109 formed by the die processing or the cutting processing, a minute beard-like burr or the like may be formed on the base film 136 or the cover film 138, or the shield electrode 140 during the processing, but the wiring 128 itself is protected by the base film 136 and the cover film 138 around it, in particular, the beard-like burr of the shield electrode 140 does not contact the wiring 128.

Third Embodiment

Figure 9:
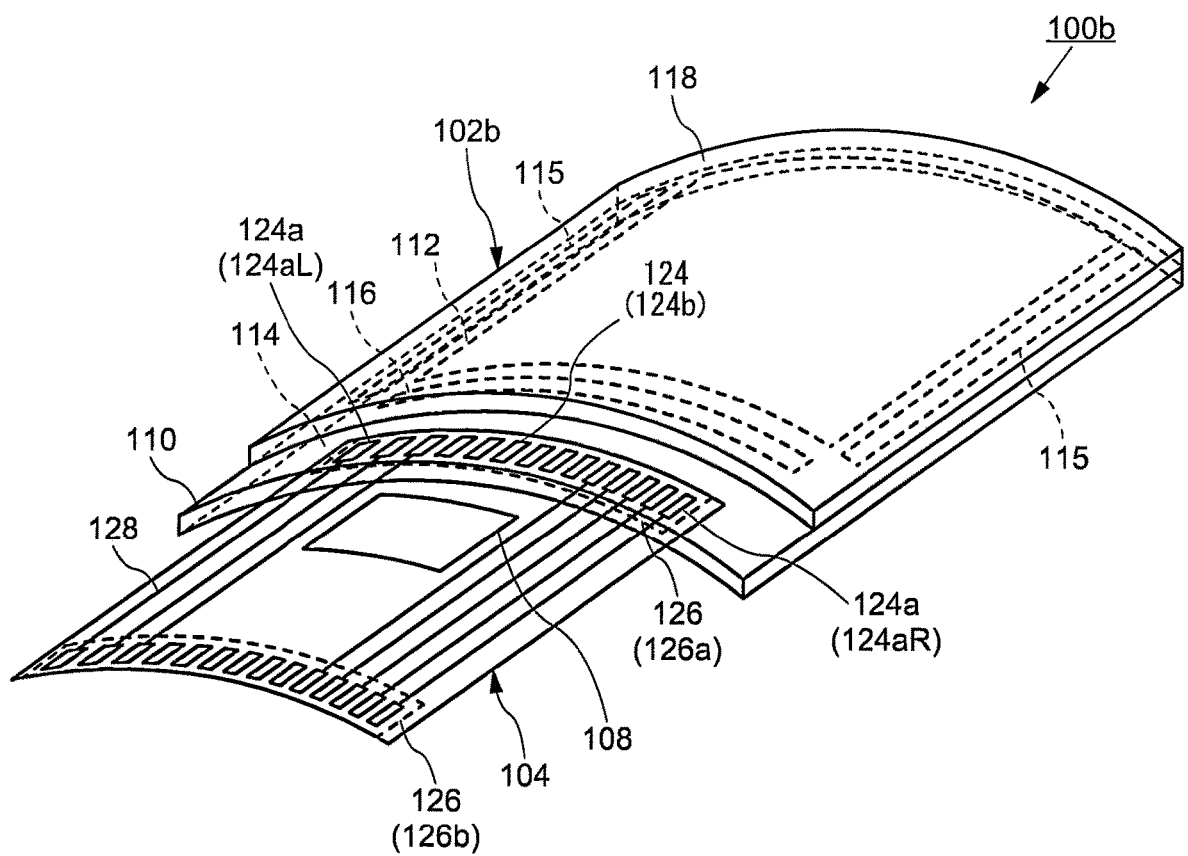
FIG. 9 shows a perspective view of a display device according to an embodiment of the present invention.

This embodiment shows a display device 100b in which the wiring substrate 104 is mounted on the display panel 102 having flexibility. FIG. 9 shows a perspective view of the display device 100b according to the present embodiment. The display device 100b includes a display panel 102b with flexibility and the wiring substrate 104 with flexibility. The display panel 102b has flexibility and a curved shape along the direction in which the terminal 124 (the first terminal group 124aL, the second terminal group 124aR, the dummy terminal group 124b) of the input terminal 114 is arranged.

The wiring substrate 104 is provided along the curved surface of the display panel 102b. That is, the wiring substrate 104 also has a curved shape. The wiring substrate 104 includes the first region 130 and the second region 132. The cross-sectional area of the cross section along the curved surface of the first region 130 is smaller than the cross-sectional area of the cross section of the second region. Since the wiring substrate 104 includes the first region 130, it can be freely curved with the display panel 102b. The first region 130 is realized by including the opening 108 or the notch portion (not shown) in the same manner as the first embodiment. In this embodiment, the opening 108 of the wiring substrate 104 is formed after being attached to the display panel 102b in the same manner as the second embodiment.

If an opening such as a slit is formed in advance in the wiring substrate, distortion occurs in the mounting process, it is conceivable that adversely affect the accuracy of the bonding. However, as in the present embodiment, after attaching the wiring substrate 104 to the display panel 102, by forming the opening 108, it is possible to ensure the accuracy of the bonding. Depending on how the display panel 102b is curved, the plurality of openings 108 may be formed in the wiring substrate 104. The wiring substrate 104, instead of the opening 108, may be provided with the notch portion 109 as shown in FIG. 7. In either case, by performing processing to reduce the cross-sectional area of the cross section of the part of region of the wiring substrate 104, it is possible to provide the wiring substrate 104 in a stable state to the display panel 102 having a curved surface.

The display device 100b according to the present embodiment can be manufactured by the same method as the manufacturing method shown in the second embodiment.

Fourth Embodiment

Figure 10A:
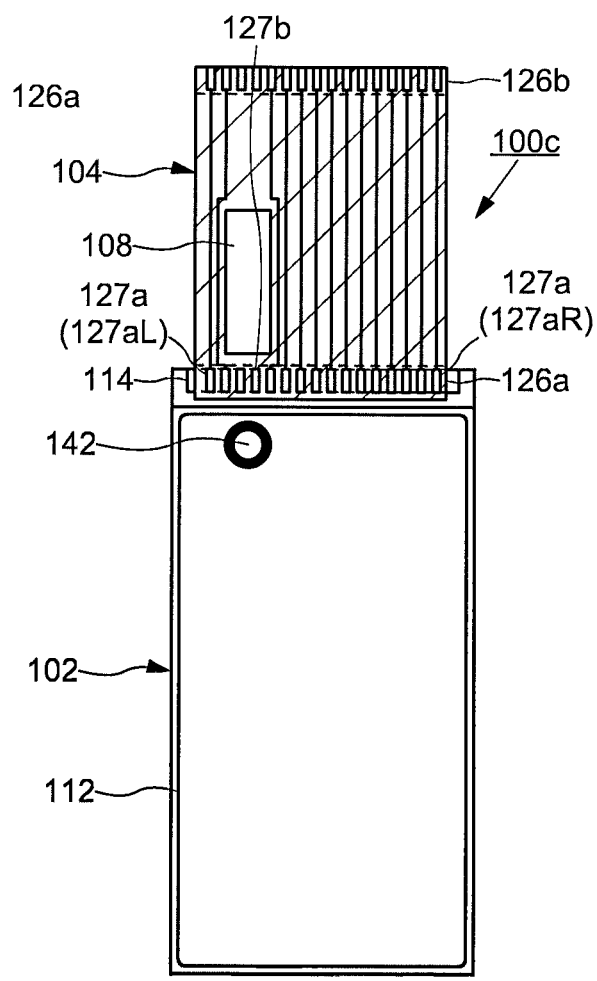
FIG. 10A shows a front view of an electric device having a camera module according to an embodiment of the present invention with a wiring substrate attached to a display panel.
Figure 10B:
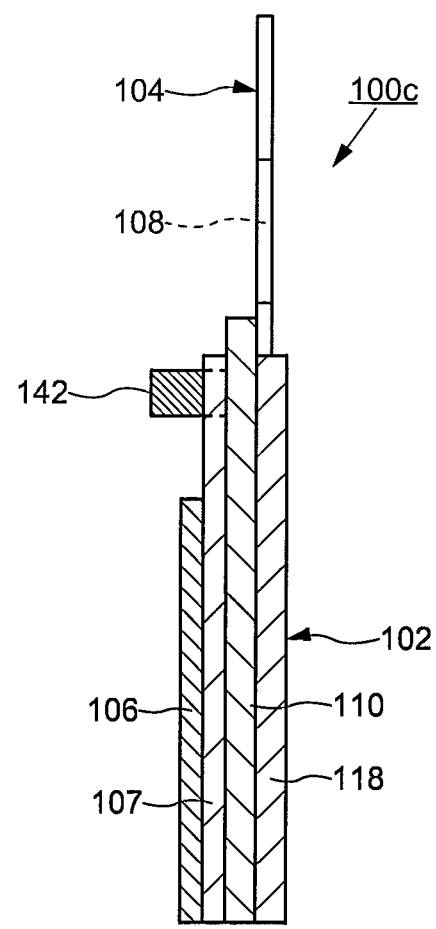
FIG. 10B shows a side view of an electric device having a camera module according to an embodiment of the present invention with a wiring substrate attached to a display panel.
Figure 10C:
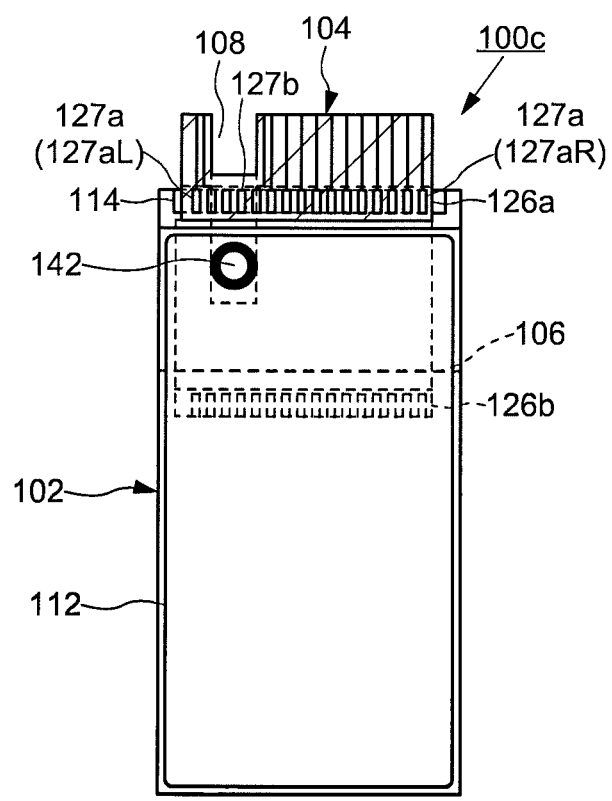
FIG. 10C shows a front view of an electric device having a camera module according to an embodiment of the present invention in which a display panel and a circuit board are connected by a wiring substrate.

This embodiment shows an aspect of an electric device having a camera module. FIG. 10A shows a front view of the electric device 100c with the wiring substrate 104 attached to the display panel 102, and FIG. 10B shows a side view thereof. FIG. 10C shows a front view of the electric device 100c with the wiring substrate 104 bent and connected to the display panel 102 and the circuit board 106, and FIG. 10D shows a side view thereof.

As shown in FIG. 10A, the electric device 100c is provided with a camera module 142 on a region overlapping with the display part 112. As shown in FIG. 10B, the camera module 142 is provided on the rear side of the display panel 102. The camera module 142 is provided to allow imaging of the front side through the display panel 102. In the display panel 102, the region overlapping the camera module 142 is a non-display region, the light guide path is provided so that the outside light can be incident. On the back side of the display panel 102, a circuit board 106, a backlight module 107 and the like can be appropriately arranged.

Figure 10D:
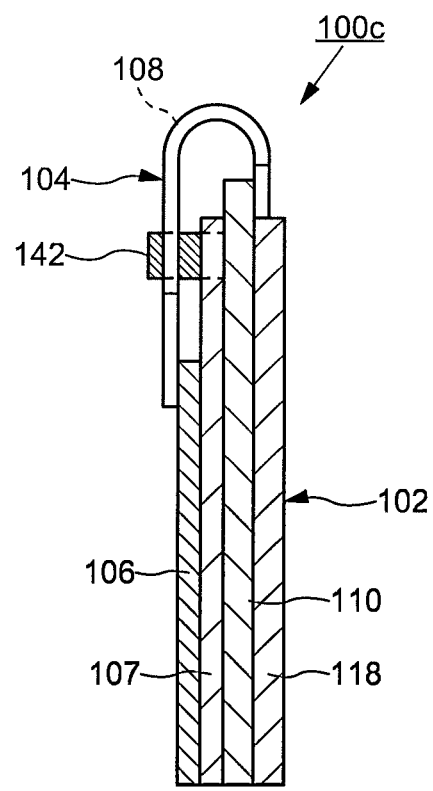
FIG. 10D shows a side view of an electric device having a camera module according to an embodiment of the present invention in which a display panel and a circuit board are connected by a wiring substrate.

FIGS. 10C and 10D show the wiring substrate 104 bent to connect the display panel 102 to the circuit board 106. In the wiring substrate 104, each of the first connection terminal group 127aL, the second connection terminal group 127aR, and the dummy terminal group 127b included in the first connection part 126a is electrically connected to the input terminal 114 of the display panel 102, and the second connection part 126b is electrically connected to the circuit board 106. In the wiring substrate 104, the opening 108 is provided in the region overlapping the camera module 142 when the wiring substrate 104 bent. With such the opening 108 provided, in addition to being able to easily bend the wiring substrate 104, even if the camera module 142 protrudes at the back of the display panel 102, the wiring substrate 104 can be bent so as not to interfere with the camera module 142. That is, it is possible to bend the wiring substrate 104 so that the camera module 142 protrudes from the opening 108. In other words, the wiring substrate 104 has the opening 108 so that it can be bent to reduce the radius of curvature without being affected by the camera module 142 provided on the back of the display panel 102.

The position of the camera module 142 provided on the back of the display part 112 is optional and for example, it may be provided toward the center of the upper end of the display part 112. The position and the size of the opening 108 in the wiring substrate 104 can be appropriately set in accordance with the arrangement of the camera module 142.

In place of the camera module or in addition to the camera module, the wiring substrate 104 can be compactly folded by similarly providing the opening 108 when a module such as a sensor is placed on the back side of the display panel 102. The wiring substrate 104 can obtain the same effects even if the notch portion 109 as shown in FIG. 7 is provided instead of the opening 108.

According to the present embodiment, by providing the opening 108 to the wiring substrate 104 in accordance with the arrangement of the components such as the camera module to be installed on the back of the display panel 102, it is possible to reduce the repulsive force against the bending of the wiring substrate 104, and to bend the wiring substrate 104 so as not to interfere with the installed components.

What is claimed is:

1. A display device comprising:
    a display panel including a display surface and a back surface opposed to the display surface;
    a flexible printed wiring substrate facing the back surface of the display panel; and
    an electronic component on the back surface of the display panel;
    wherein:
    the display panel includes a display part on the display surface,
    the flexible printed wiring substrate includes an opening through the flexible wiring substrate,
    the opening overlaps with the electronic component, and
    the electronic component and the opening overlap the display part.

2. The display device according to claim 1, wherein the electronic component is a camera module or a sensor module.

3. The display device according to claim 2, wherein the opening is arranged inside a peripheral portion of the flexible printed wiring substrate.

4. The display device according to claim 3, wherein the flexible printed wiring substrate is bent from a side of the display surface to a side of the back surface.

5. The display device according to claim 4, wherein the electronic component is located inside of the opening of the flexible printed wiring substrate.

6. The display device according to claim 4, further comprising:
    a circuit board on the back surface,
    wherein the flexible printed wiring substrate is electrically connected to the circuit board.

7. The display device according to claim 5, wherein the opening is extended into a bent region of the flexible printed wiring substrate.

* * * * *